(12) United States Patent
Morita et al.

(10) Patent No.: US 6,897,482 B2
(45) Date of Patent: May 24, 2005

(54) TRANSISTOR AND DISPLAY COMPRISING IT

(75) Inventors: Satoshi Morita, Tottori (JP); Osamu Kobayashi, Tottori (JP); Kohei Oda, Tottori (JP)

(73) Assignees: Sanyo Electric Co., Ltd., Osaka (JP); Tottori Sanyo Electric Co., Ltd., Tottori (JP)

( * ) Notice: Subject to any disclaimer, the term of this patent is extended or adjusted under 35 U.S.C. 154(b) by 0 days.

(21) Appl. No.: 10/398,376

(22) PCT Filed: Oct. 9, 2001

(86) PCT No.: PCT/JP01/08867

§ 371 (c)(1),
(2), (4) Date: Apr. 4, 2003

(87) PCT Pub. No.: WO02/31887

PCT Pub. Date: Apr. 18, 2002

(65) Prior Publication Data

US 2004/0031964 A1 Feb. 19, 2004

(30) Foreign Application Priority Data

Oct. 12, 2000 (JP) ........................................ 2000-312454

(51) Int. Cl.⁷ ............................................... H01C 25/15
(52) U.S. Cl. .......................... 257/72; 257/59; 257/457; 257/61; 257/411; 257/410
(58) Field of Search ........................... 257/72, 59, 437, 257/61, 411, 410, 788, 768; 345/92, 76, 72, 87, 43, 204

(56) References Cited

U.S. PATENT DOCUMENTS 5,003,356 A * 3/1991 Wakai et al. ................ 257/390
6,335,781 B2 * 1/2002 Kim et al. ................... 349/187

FOREIGN PATENT DOCUMENTS

| JP | 60-189969 A1 | 9/1985 |
| JP | 64-82674 A1 | 3/1989 |
| JP | 2-285326 A1 | 11/1990 |
| JP | 09-15642 A1 | 1/1997 |
| JP | 10-123572 A1 | 5/1998 |
| JP | 2000-196098 A1 | 7/2000 |
| JP | 2000196098 A * | 7/2000 ......... H01L/29/786 |

OTHER PUBLICATIONS

International Search Report (English Translation).
International Examination Report.

* cited by examiner

Primary Examiner—Eddie Lee
Assistant Examiner—Thomas Magee
(74) Attorney, Agent, or Firm—McDermott Will & Emery LLP

(57) ABSTRACT

A transistor has a source electrode and a drain electrode formed with a predetermined interval secured in between on a semiconductor layer formed to perspectively overlap a gate electrode. The source and drain electrodes are each longer in their lengthwise direction than in their widthwise direction. The source electrode has a recessed portion formed therein to allow the tip portion of the drain electrode in. The semiconductor layer protrudes out of the gate electrode to form a portion that does not overlap the gate electrode but overlaps the source electrode and a portion that does not overlap the gate electrode but overlaps the drain electrode. Thus, the protruding portion that overlaps the source electrode and the protruding portion that overlaps the drain electrode are separated from each other by the gate electrode so as to be independent of each other. This prevents short-circuiting between the source and drain that results when the portions of the semiconductor islands protruding out of the gate electrode become conductive through a photoelectric effect brought about by the light that travels past the gate electrode or by another cause.

6 Claims, 9 Drawing Sheets

TRANSISTOR AND DISPLAY COMPRISING IT

TECHNICAL FIELD

The present invention relates to a transistor, and to a display provided with such a transistor. More specifically, the present invention relates to transistors formed on a substrate so as to form an array, and to a display device having pixel electrodes formed so as to correspond individually to such transistors so that display is controlled pixel by pixel by way of those pixel electrodes.

BACKGROUND ART

Commercially available display devices are classified into tube-type display devices, such as CRTs, and flat display devices, such as liquid crystal display devices, EL display devices, and plasma display devices. A flat display device is composed essentially of an aggregation of pixels, and display on it is controlled pixel by pixel so as to produce an overall image. In a flat display device, for example a liquid crystal display device, an array of thin-film transistors are formed on a glass substrate so that display pixels are driven individually by those transistors.

FIG. 11 shows the structure of a thin-film transistor (hereinafter referred to as a "TFT") that is conventionally used in a liquid crystal display device. In the TFT shown in the figure, on top of a gate electrode G, a semiconductor layer SI of, for example, silicon is formed with an insulating film interposed in between, and then, further on top, a source electrode S and a drain electrode D, both rectangular in shape as seen in a plan view, are arranged side by side with a predetermined interval secured in between. Ideally, the source and drain electrodes S and D should be formed in the designed positions. Occasionally, however, they are formed in deviated positions as shown in FIGS. 12 and 13. If, as shown in FIG. 12, the source and drain electrodes S and D deviate in the vertical direction of the figure while maintaining equal overlaps with the gate electrode G, the areas (hatched in the figure) over which the source and drain electrodes S and D overlap the gate electrode G remain unchanged, and thus the parasitic capacitance of the TFT remains almost unchanged. However, if, as shown in FIG. 13, the deviation occurs in the horizontal direction of the figure, one of the source and drain electrodes S and D comes to overlap the gate electrode G over a larger area than the other. This results in a great variation in the parasitic capacitance.

Based on what has been described thus far, one can recognize the need to reduce variations in the parasitic capacitance of thin-film transistors, in particular those used to drive display pixels, and the need to achieve uniform image quality on a display device of which the display pixels are driven by transistors.

DISCLOSURE OF THE INVENTION

According to the present invention, in a transistor having a source electrode and a drain electrode formed side by side with a predetermined interval secured in between on a semiconductor layer formed so as to perspectively overlap a gate electrode, the edge of the drain electrode that faces the source electrode has corners rounded so as to describe a convex curved line, the edge of the source electrode that faces the drain electrode is formed so as to describe a concave curved line corresponding to the edge of the drain electrode describing the convex curved line, the edge of the source electrode that does not face the drain electrode is formed so as to describe a convex curved line along the edge of the source electrode that faces the drain electrode so that the source electrode has a substantially uniform width, the semiconductor layer protrudes out of the gate electrode to form a portion that overlaps the source electrode and a portion that overlaps the drain electrode, with the protruding portion that overlaps the source electrode and the protruding portion that overlaps the drain electrode separated from each other by the gate electrode so as to be independent of each other, and the portion of the semiconductor layer that overlaps the gate electrode and that faces the edge of the source electrode that does not face the drain electrode is partially cut off along the profile of the source electrode. In this structure, the drain electrode is formed so as to describe a curved line with a round tip, and is bar-shaped as a whole. This makes it possible to reduce the area over which the drain electrode, the semiconductor layer, and the gate electrode perspectively overlap one another. Thus, it is possible to reduce the parasitic capacitance between the drain and gate electrode. It is also possible to reduce variations in parasitic capacitance among individual TFTs. Moreover, the edge of the source electrode facing the drain electrode is formed so as to describe a concave curved line corresponding to the shape of the edge of the drain electrode. This makes the channel width between the source and drain electrodes uniform and thereby enhances the characteristics of the transistor. In addition, the edge of the source electrode that does not face the drain electrode is formed so as to describe a convex curved line along the edge of the source electrode that faces the drain electrode so that the source electrode has a substantially uniform width. This helps make the width of the source electrode uniform and narrow, and thus helps reduce the influence of parasitic capacitance. Furthermore, the semiconductor layer protrudes out of the gate electrode to form a portion that overlaps the source electrode and a portion that overlaps the drain electrode. Thus, even if the position of a mask deviates and as a result the positions of the source and drain electrodes deviate, there occurs only a slight variation in parasitic capacitance. Moreover, those protruding portions are separated from each other by the gate electrode so as to be independent of each other. Thus, even if light is incident on the TFT from below, it is possible to prevent short-circuiting between the source and drain that results when the portions of the semiconductor layer protruding out of the gate electrode become conductive through an photoelectric effect brought about by the light that travels past the gate electrode or by another cause. Moreover, the portion of the semiconductor layer that overlaps the gate electrode and that faces the edge of the source electrode that does not face the drain electrode is partially cut off along the profile of the source electrode. This helps minimize the area of the semiconductor layer, and thus helps reduce the leak current resulting from light incident on the TFT from above.

Alternatively, according to the present invention, in a transistor having a source electrode and a drain electrode formed side by side with a predetermined interval secured in between on a semiconductor layer formed so as to perspectively overlap a gate electrode the edge of the drain electrode that faces the source electrode is formed so as to describe a convex arc, the edge of the source electrode that faces the drain electrode is formed so as to describe a concave arc along the convex-arc-shaped edge of the drain electrode so that the distance between the source and drain electrodes is substantially uniform, the edge of the source electrode that does not face the drain electrode is formed so as to describe a convex arc along the edge of the source electrode that faces the drain electrode so that the source electrode has a substantially uniform width, the semiconductor layer protrudes out of the gate electrode to form a portion that overlaps the source electrode and a portion that overlaps the drain electrode, with the protruding portion that overlaps the source electrode and the protruding portion that overlaps the drain electrode separated from each other by the gate electrode so as to be independent of each other, and the portion of the semiconductor layer that overlaps the gate electrode and that faces the edge of the source electrode that does not face the drain electrode is given a profile that runs along the profile of the source electrode. In this structure, the drain electrode is formed so as to describe an arc with a convex tip, and is bar-shaped as a whole. This makes it possible to reduce the area over which the drain electrode, the semiconductor layer, and the gate electrode perspectively overlap one another. Thus, it is possible to reduce the parasitic capacitance between the drain and gate electrode. It is also possible to reduce variations in parasitic capacitance among individual TFTs. Moreover, the edge of the source electrode facing the drain electrode is formed so as to describe a concave arc along the above-mentioned edge of the drain electrode. This makes the channel width between the source and drain electrodes uniform and thereby enhances the characteristics of the transistor. In addition, the edge of the source electrode that does not face the drain electrode is formed so as to describe a convex arc along the edge of the source electrode that faces the drain electrode so that the source electrode has a substantially uniform width. This helps make the width of the source electrode uniform and narrow, and thus helps reduce the influence of parasitic capacitance. Furthermore, the semiconductor layer protrudes out of the gate electrode to form a portion that overlaps the source electrode and a portion that overlaps the drain electrode. Thus, even if the position of a mask deviates and as a result the positions of the source and drain electrodes deviate, there occurs only a slight variation in parasitic capacitance. Moreover, those protruding portions are separated from each other by the gate electrode so as to be independent of each other. Thus, even if light is incident on the TFT from below, it is possible to prevent short-circuiting between the source and drain that results when the portions of the semiconductor layer protruding out of the gate electrode become conductive through an photoelectric effect brought about by the light that travels past the gate electrode or by another cause. Moreover, the portion of the semiconductor layer that overlaps the gate electrode and that faces the edge of the source electrode that does not face the drain electrode is given a profile that runs along the profile of the source electrode, i.e., is arc-shaped. This helps minimize the area of the semiconductor layer, and thus helps reduce the leak current resulting from light incident on the TFT from above.

According to the present invention, in a display device that achieves display by using any of the transistors described above, gate conductors and source conductors are arranged in a grid-like configuration, the transistors are located at the intersections between the gate and source conductors, and the drain electrodes of the transistors are arranged substantially parallel to the source conductors. In this structure, even if the positions of the source and drain electrodes deviate in the direction parallel to the source conductors, the gate-drain parasitic capacitance varies only slightly.

According to the present invention, in a display device that achieves display by using any of the transistors described above, source conductors and gate conductors are arranged in a grid-like configuration, the transistors are located at the intersections between the source and gate conductors, and the drain electrodes of the transistors are arranged substantially perpendicularly to the source conductors. In this structure, even if the positions of the source and drain electrodes deviate in the direction perpendicular to the source conductors, the gate-drain parasitic capacitance varies only slightly. Moreover, when the source and drain electrodes are formed, accurate positioning is required only in the direction perpendicular to the source conductors, and not so accurate positioning is required in the direction parallel to the source conductors.

According to the present invention, in a display device that achieves display by using any of the transistors described above, the transistors, together with pixel electrodes connected thereto, are arranged in the cells sectioned off by the gate and source conductors, auxiliary capacitance electrodes sandwiched between a gate insulating film and a protective film from above and from below are arranged between the gate conductor of each stage and the pixel electrode of the next stage arranged so as to overlap the gate conductor, contact holes are formed in the protective film lopsidedly in the side of each stage where the transistors are formed so as to permit the auxiliary capacitance electrodes to connect to the pixel electrodes, and cuts are formed at the edges of the pixel electrodes located above the auxiliary capacitance electrodes in the side of each stage opposite to where the contact holes are formed. These cuts help widen the interval between the pixel electrode of one stage and that of the next, and thus helps prevent short-circuiting between adjacent pixel electrodes and the resulting degradation in display quality.

BEST MODE FOR CARRYING OUT THE INVENTION

Hereinafter, embodiments of the present invention will be described with reference to the drawings.

In a first embodiment of the invention, a plurality of TFTs 1 having an inverted staggered structure are arranged in a matrix-like configuration so as to form a TFT array 2. These are structured as described below with reference to FIGS. 1 and 2.

Figure 1:
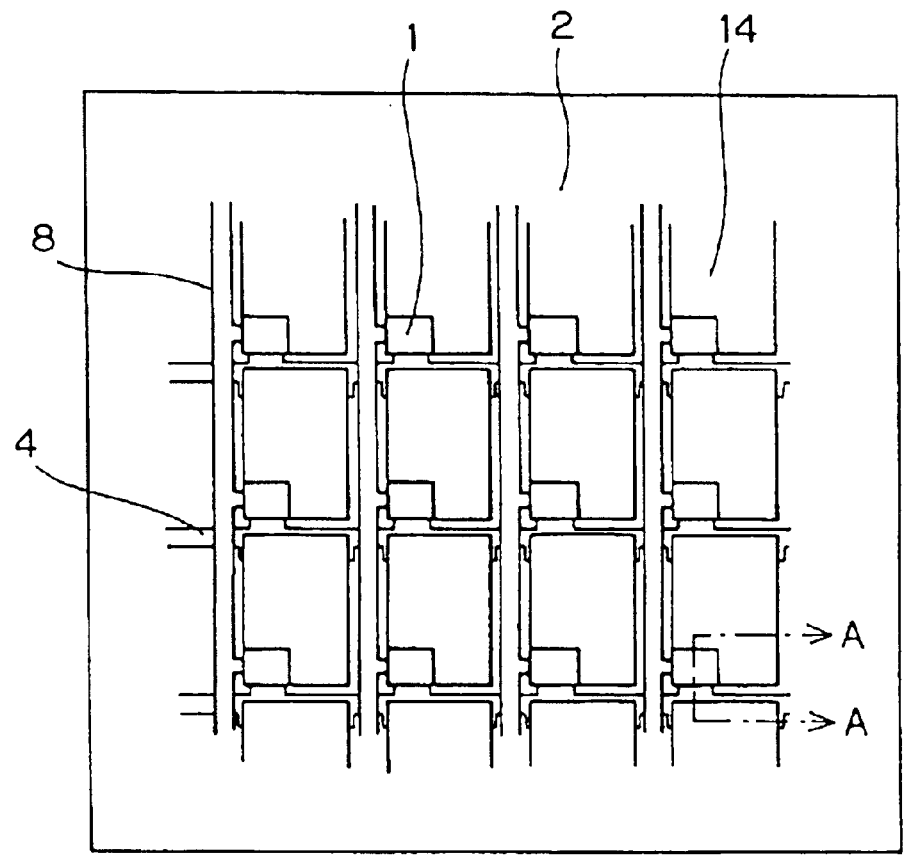
FIG. 1 is a plan view showing an outline of the structure of the TFT array of a first embodiment of the invention.
Figure 2:
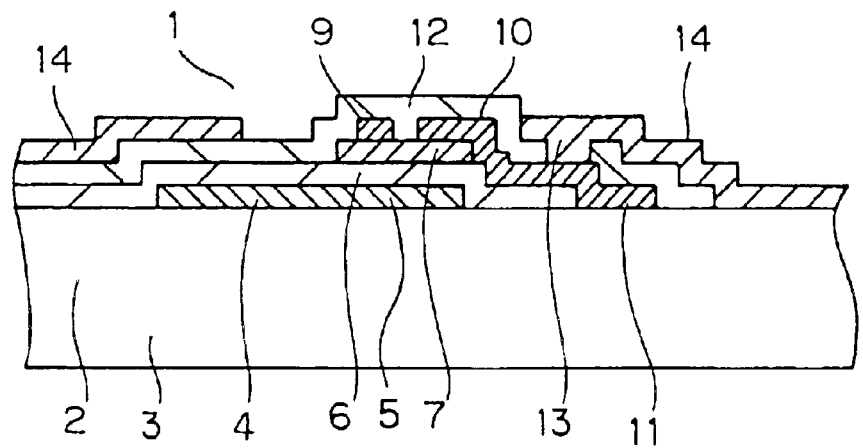
FIG. 2 is a sectional view taken along line A—A shown in FIG. 1.

The TFT array 2 has a plurality of gate conductors 4, extending in the horizontal direction of FIG. 1, formed at predetermined intervals on a substrate 3 of, for example, no-alkali glass. From the gate conductors 4, gate electrodes 5 branch off at predetermined intervals. The gate electrodes 5 are covered with a gate insulating film 6 of, for example, silicon nitride (SiNx). On top of the gate insulating film 6, a semiconductor layer is formed in an insular pattern, i.e., as semiconductor islands 7, so as to perspectively (i.e., as seen in a plan view) overlap the gate electrodes 5. The semiconductor islands 7 are formed of an amorphous silicon layer.

After the formation of the semiconductor islands 7, a plurality of source conductors 8 are formed at predetermined intervals perpendicularly to the gate conductors 4. For each of the cells sectioned off by the gate and source conductors 4 and 8 arranged in a grid-like formation, more precisely, for each of the intersections between the gate and source conductors 4 and 8, one TFT 1 is arranged. From the source conductors 8, source electrodes 9 branch off at the same pitch at which the gate conductors 4 are arranged. Beside each of the source electrodes 9, a drain electrode 10 is formed with a predetermined interval secured in between. The drain electrode 10, at its base, connects to a contact electrode 11 that makes contact with a pixel electrode.

The TFT array 2, including the semiconductor islands 7, source electrodes 9, drain electrodes 10, and other parts, is covered with a protective film 12 of, for example, silicon nitride (SiNx). In this protective film 12, contact holes 13 are formed that lead to contact electrodes 11. Moreover, contiguous with each TFT 1, a transparent pixel electrode 14 made of ITO, IZO, or the like is formed. The pixel electrodes 14 are arranged in a matrix-like formation so as to correspond, one-to-one, to the TFTs 1, and connect to the corresponding TFTs 1 through the contact holes 13. In a display device of a reflective type, the pixel electrodes 14 may be formed of a reflective film of, for example, a metal.

Next, with reference to FIGS. 3 and 4, the structure of the TFT 1 of the first embodiment will be described.

Figure 3:
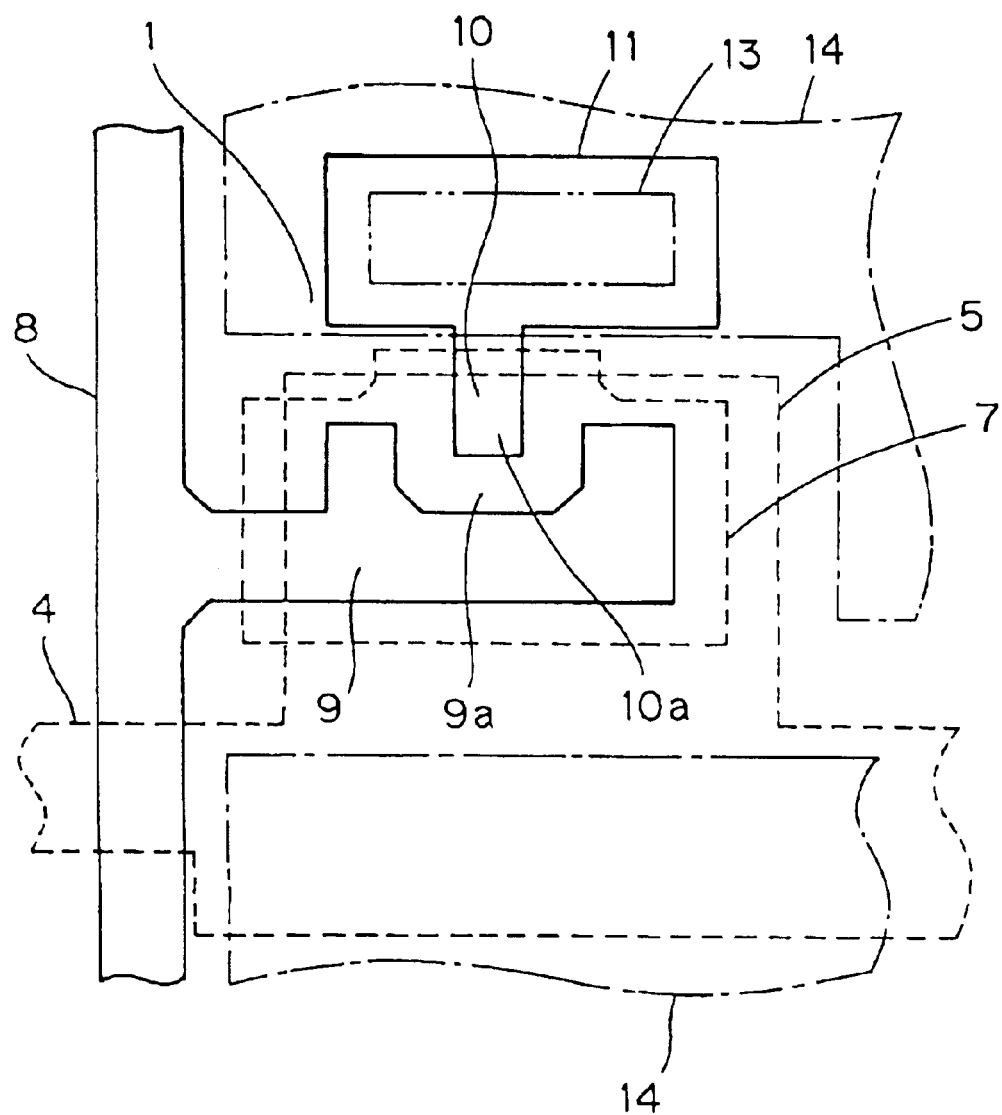
FIG. 3 is a plan view schematically showing the structure of the TFT of the first embodiment.

As shown in FIG. 3, both the source electrode 9 and the drain electrode 10 are elongate, i.e., longer in their lengthwise direction than in their widthwise direction. The lengthwise direction of the source electrode 9 is perpendicular to the source conductor 8, and the lengthwise direction of the drain electrode 10 is parallel to the source conductor 8. The drain electrode 10 has its tip portion 10a arranged so as to face one edge of the source electrode 9 with a predetermined interval secured in between.

The greater parts of both the source and drain electrodes 9 and 10 perspectively overlap the semiconductor island 7, and perspectively overlap the gate electrode 5 with the semiconductor island 7 and the gate insulating film 6 interposed in between. Both the source and drain electrodes 9 and 10 are so arranged that their lengthwise direction perpendicularly crosses an edge of the gate electrode 5. Parts of the source and drain electrodes 9 and 10 are located outside the semiconductor island 7. The part of the source electrode 9 located outside the semiconductor island 7 connects to the source conductor 8, and the part of the drain electrode 10 located outside the semiconductor island 7 connects to the contact electrode 11.

The source electrode 9 has a recessed portion 9a formed in its edge facing the drain electrode 10 to allow the tip portion 10a of the drain electrode 10 in. Between the tip portion 10a of the drain electrode 10 and the recessed portion 9a of the source electrode 9, a channel having a predetermined gap (i.e., the channel width) is formed. Quite naturally, this channel is not linear in shape, but has a nonlinear shape that runs along the profile of the recessed portion 9a.

The parasitic capacitance of the TFT 1 results principally from the portions of the source and drain electrodes 9 and 10 in which they perspectively overlap the gate electrode 5 with the gate insulating film 6 and the semiconductor island 7 interposed in between. In particular, the parasitic capacitance resulting from the overlap between the drain electrode 10 and the gate electrode 5 greatly influences the pixel voltage, causing variations in it. In the structure shown in FIG. 3, this gate-drain parasitic capacitance is reduced, and variations in it also are reduced for the reasons described below.

The parasitic capacitance itself is reduced in the following way. As described above, the drain electrode 10 is elongate, i.e., longer in its lengthwise direction than in its widthwise direction, and its tip portion is allowed in the recessed portion 9a formed in the source electrode 9. This helps reduce the area over which the drain electrode 10 overlap the semiconductor island 7 and the gate electrode 5, and thus helps reduce the parasitic capacitance. This also helps reduce leak current. Moreover, the source and drain electrodes 9 and 10 (these are formed of the same metal simultaneously) are arranged side by side in the vertical direction of the figure, and therefore, even if their positions deviate slightly in the horizontal direction of the figure, the gate-drain parasitic capacitance remains unchanged. By contrast, if the positions of the source and drain electrodes 9 and 10 deviate in the vertical direction of the figure, the area over which the drain electrode 10 overlaps the gate electrode 5 varies slightly. Here, the fact that the lengthwise direction of the drain electrode 10 perpendicularly crosses an edge of the gate electrode 5 proves to be advantageous. Specifically, that edge of the gate electrode 5 crosses the drain electrode 10 in the direction of the shorter sides thereof, and therefore, even if the place at which the edge crosses the drain electrode 10 deviates in the lengthwise direction thereof, the area over which the drain electrode 10 overlaps the gate electrode 5 varies only slightly. The advantage of this structure will be clear when compared with a structure in which the drain electrode 10 is arranged perpendicularly to its arrangement in the embodiment being discussed, i.e., an edge of the gate electrode 5 crosses the drain electrode 10 in the lengthwise direction thereof and the place at which the edge crosses the drain electrode 10 deviates in the direction of the shorter sides thereof. In this way, even if the drain electrode 10 deviates in its lengthwise direction, the area over which the drain electrode 10 overlaps the gate electrode 5 varies only slightly, resulting in reduced variations in the gate-drain parasitic capacitance.

This advantage, i.e., reduced variations in the area-over which the drain electrode 10 overlaps the gate electrode 5 even in case of deviation of the source and the drain electrodes 9 and 10 in the vertical direction of the figure, results from the fact that the drain electrode 10 has an elongate shape along the vertical direction of the figure. This shape of the drain electrode 10, however, also has the disadvantage of shortening the total length of the channel between the source and drain electrodes 9 and 10. To overcome this, in the TFT 1 of the first embodiment, the source electrode 9 has the recessed portion 9a formed in it in order to form a channel that has a nonlinear shape surrounding the tip portion 10a. This makes it possible to secure a comparatively long total channel length.

All over the area over which the source and drain electrodes 9 and 10 overlap the gate electrode 5, the semiconductor island 7 is interposed in between. Where the source electrode 9 crosses an edge of the gate electrode 5, the semiconductor island 7 protrudes slightly out of the gate electrode 5, forming a protruding portion in which the semiconductor island 7 does not overlap the gate electrode 5 but overlaps the source electrode 9. Likewise, where the drain electrode 10 crosses an edge of the gate electrode 5, the semiconductor island 7 protrudes slightly out of the gate electrode 5, forming a protruding portion in which the semiconductor island 7 does not overlap the gate electrode 5 but overlaps the drain electrode 10. This helps reduce variations in the parasitic capacitance formed between the source and drain electrodes 9 and 10 and the gate electrode 5. The protruding portion on the source electrode 9 side and that on the drain electrode 10 side are separated from each other by the gate electrode 5 so as to form insular patches that are independent of each other. This prevents short-circuiting between the source and drain that results when the portions of the semiconductor island 7 protruding out of the gate electrode 5 become conductive through an photoelectric effect brought about by the light that travels past the gate electrode 5 or by another cause.

Figure 4:
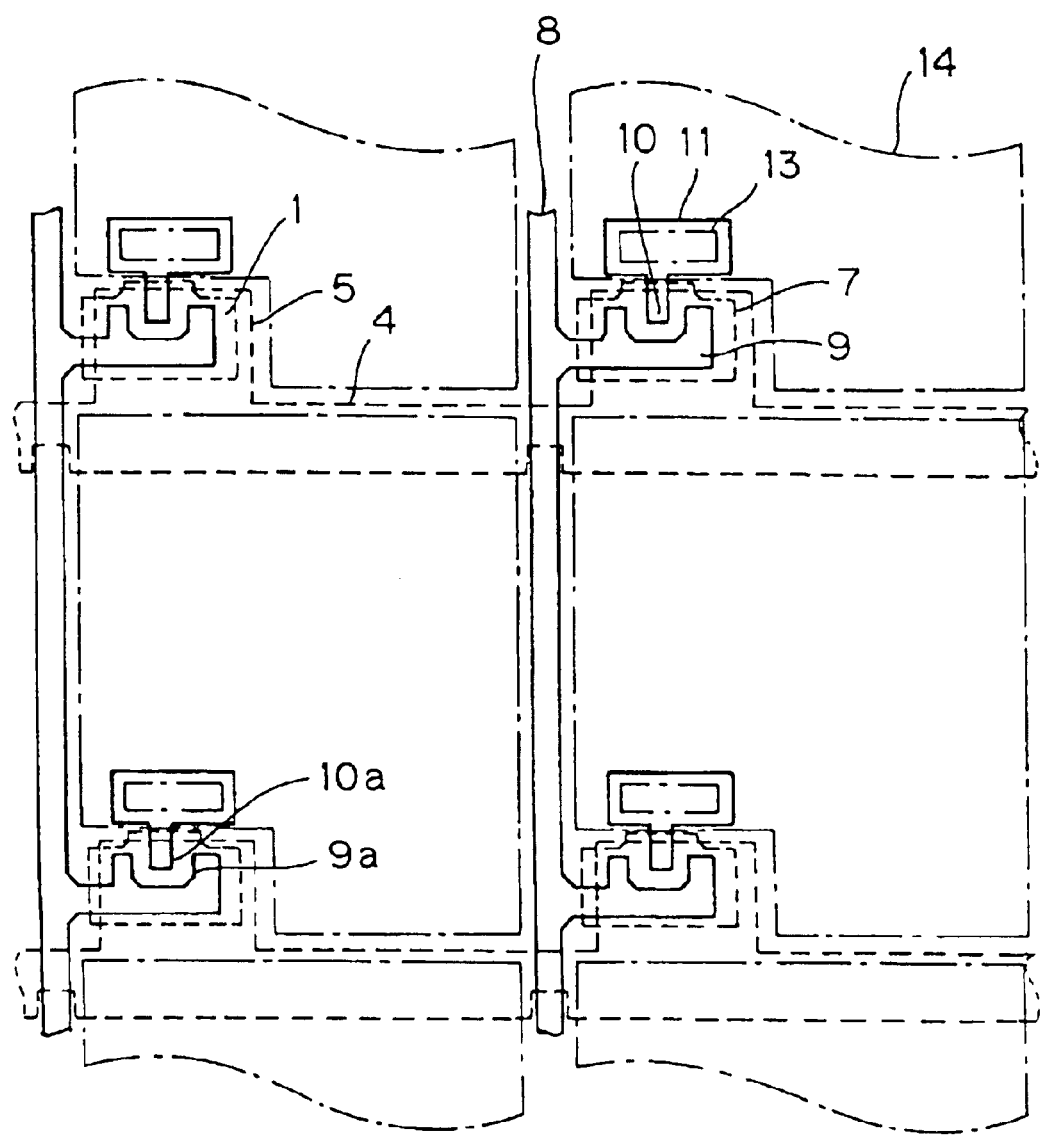
FIG. 4 is a plan view showing the array structure of the TFTs of the first embodiment.
Figure 5:
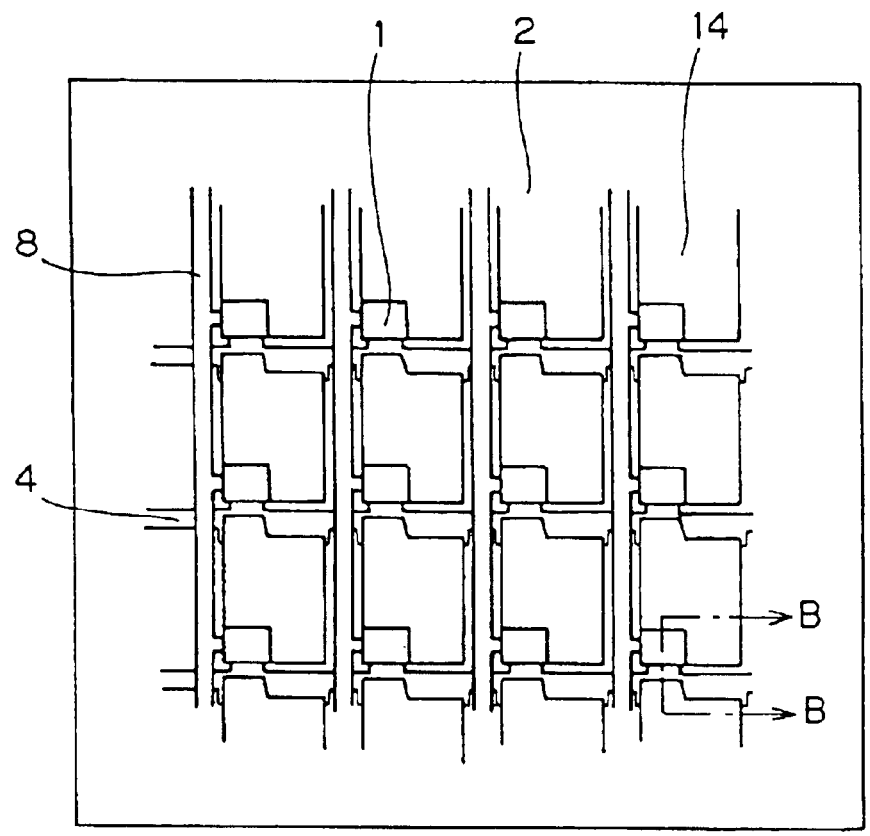
FIG. 5 is a plan view showing an outline of the structure of the TFT array of a second embodiment of the invention.
Figure 6:
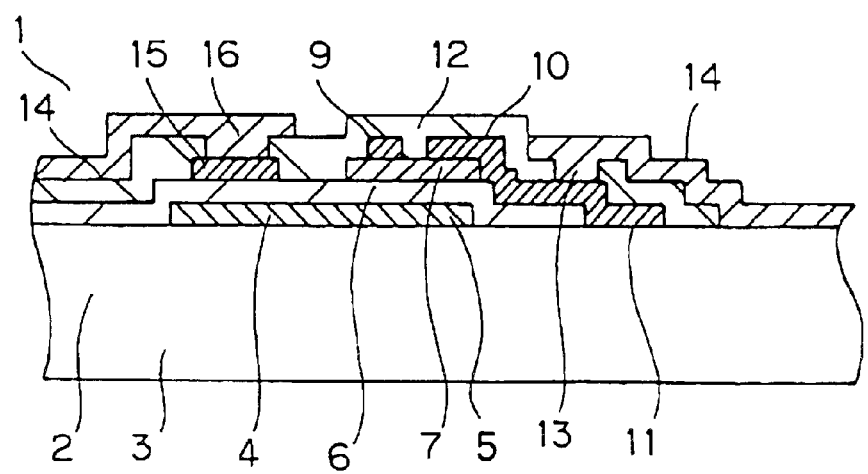
FIG. 6 is a sectional view taken along line B—B shown in FIG. 1.
Figure 7:
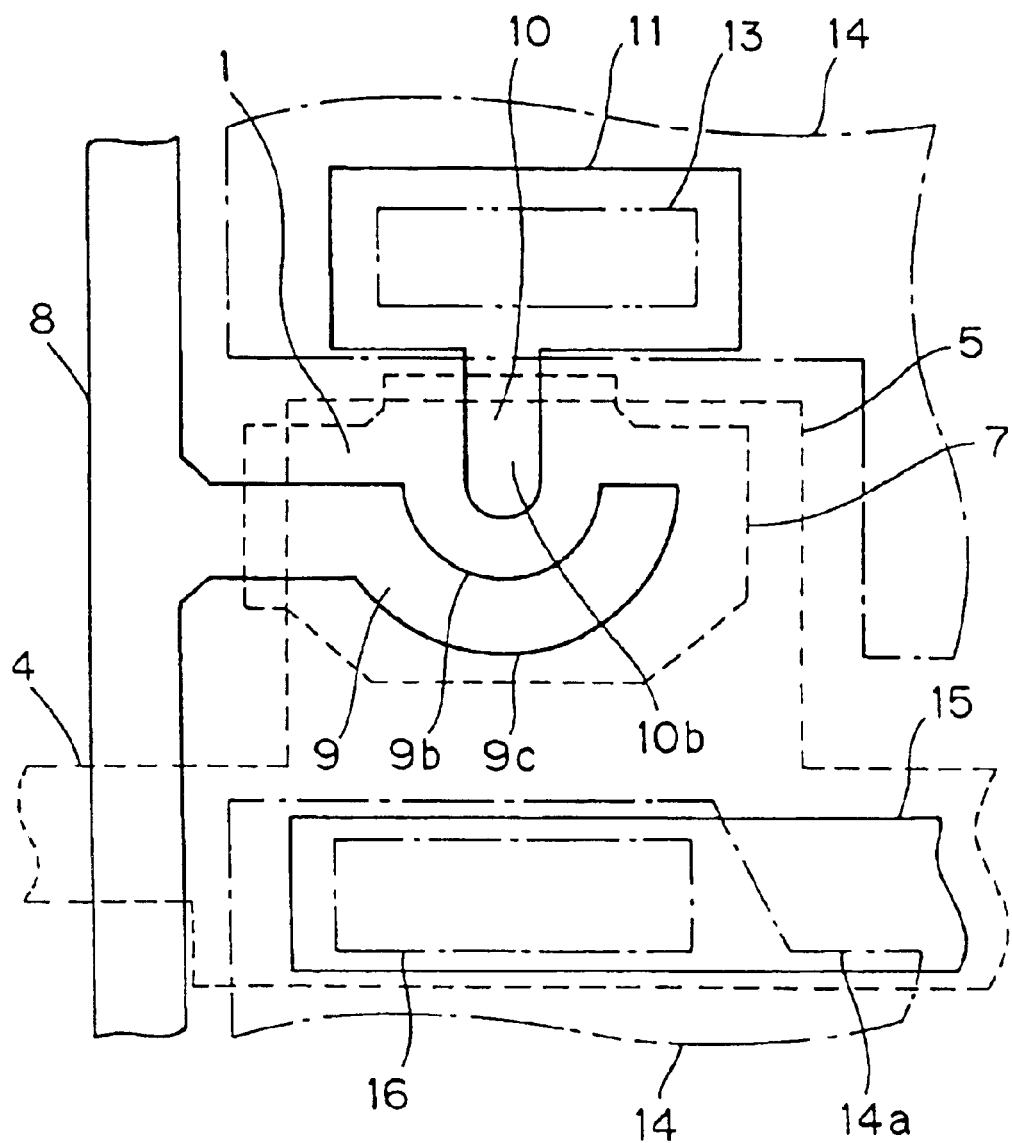
FIG. 7 is a plan view schematically showing the structure of the TFT of the second embodiment.

FIG. 4 shows how a plurality of TFTs 1, each structured as described above, are combined individually with pixel electrodes 14 to form an array. A liquid crystal display device can be built by arranging such a TFT array 2, with reduced variations in the parasitic capacitance of the TFTs 1 constituting it, as one of the two substrates arranged so as to face each other with liquid crystal sealed in between. This makes it possible to achieve display with less unevenness resulting from variations in parasitic capacitance. Even in a case where the TFT 1 is provided additionally with auxiliary capacitance to alleviate the influence of variations in parasitic capacitance, the required auxiliary capacitance can be minimized. This helps minimize the area over which the auxiliary capacitance element shields light and thereby maximize the aperture ratio of the liquid crystal display device.

Despite the merits mentioned above, the TFT 1 of the first embodiment still leaves room for improvement. Specifically, the shape of the tip portion 10a of the drain electrode 10 has the following disadvantage. When exposed, the tip portion 10a, having sharp corners, tends to be baked on with round corners. In particular, its portions smaller than exposure resolution are likely to be deformed from the designed shapes, and how they are deformed is indefinite. This makes variations likely in the drain-gate parasitic capacitance. Moreover, variations are likely also in the interval between the source and drain electrodes 9 and 10, i.e., in the channel width. These problems are overcome in the TFT 1 of a second embodiment of the invention shown in FIGS. 5 to 8.

Many of the elements constituting the TFT 1 of the second embodiment are common to the first embodiment. Therefore, in the second embodiment, such elements as are common to the first embodiment are identified with the same reference numerals and symbols, and their explanations will not be repeated. The same applies to the third embodiment, which will be described later.

In the TFT 1 of the second embodiment, the edge of the drain electrode 10 facing the source electrode 9, i.e., the edge of its tip portion 10b, has rounded corners. To give it rounded corners, the edge of the tip portion 10b is so formed as to describe a convex curve. In the figure, as the most typical example of a convex curve, a convex arc is adopted. The corners here are rounded by exposing a predetermined pattern. The corners are rounded with a radius greater than the resolution of exposure equipment. This helps reduce the difference of the actual shape of the drain electrode 10 from its designed shape, and thereby overcome the problems of variations in the area of the drain electrode 10 and thus variations in parasitic capacitance, and also variations in the interval between the source and drain electrodes 9 and 10, all resulting from the corners being rounded unexpectedly.

Accordingly, a recessed portion 9b having a concave curve is formed in the edge of the source electrode 9 facing the drain electrode 10. In the figure, as the most typical example of a concave curve, a concave arc is adopted. Thus, the channel formed between the tip portion 10b of the drain electrode 10 and the recessed portion 9b of the source electrode 9 is curved, specifically arc-shaped.

The edge 9c of the source electrode 9 opposite to the recessed portion 9b has a convex curve. In the figure, as the most typical example of a convex curve, a convex arc is adopted. Here, the convex arc of the tip portion 10b of the drain electrode 10, the concave arc of the recessed portion 9b of the source electrode 9, and the convex arc of the edge 9c thereof are concentric. Thus, the arc-shaped channel formed between the drain and source electrodes 10 and 9 has a uniform width. The source electrode 9, too, has a uniform width between the recessed portion 9b and the edge 9c. Making the source-drain interval, i.e., channel width, uniform in this way helps obtain satisfactory characteristics in the TFT 1.

In the TFT 1, by minimizing the area over which the drain electrode 10 overlaps the gate electrode 5 and the semiconductor island 7, it is possible to reduce the influence of parasitic capacitance. Likewise, by minimizing the area over which the source electrode 9 overlaps the gate electrode and the semiconductor island 7, it is possible to reduce the influence of parasitic capacitance. Forming a recessed portion 9b having a concave curve (arc) in the source electrode 9, giving the opposite edge 9c thereof a convex curve (arc), and making the width of the source electrode 9 between the recessed portion 9b and the edge 9c uniform and as small as possible as described above helps reduce the influence of parasitic capacitance.

In the description above, the use of the terms "arc" and "concentric" is not intended to mean geometrically exact circles. Any curves similar to circles, for example ellipses, serve the purpose, as long as they permit rounding of corners with a radius greater than the resolution of exposure equipment.

For maximum effect, the above-described advance rounding of corners with a radius greater than exposure resolution is preferably applied where deformation has the greatest influence on parasitic capacitance and on channel condition, specifically between the drain and source electrodes 10 and 9, in particular between the tip portion 10b of the drain electrode 10 and the recessed portion 9b of the source electrode 9. Though with less effect, it is advisable to apply the rounding of corners elsewhere. For example, it may be applied, to name a few, to the pixel electrode 14 itself, to the contact electrode 11 itself, to where the contact electrode 11 and the drain electrode 10 are connected together, to where the source electrode 9 and the source conductor 8 are connected together, to the gate electrode 5 itself, and to where the gate electrode 5 and the gate conductor 4 are connected together.

In the TFT 1 of the second embodiment also, where the source electrode 9 crosses an edge of the gate electrode 5, the semiconductor island 7 protrudes slightly out of the gate electrode 5, forming a protruding portion in which the semiconductor island 7 does not overlap the gate electrode 5 but overlaps the source electrode 9. Likewise, where the drain electrode 10 crosses an edge of the gate electrode 5, the semiconductor island 7 protrudes slightly out of the gate electrode 5, forming a protruding portion in which the semiconductor island 7 does not overlap the gate electrode 5 but overlaps the drain electrode 10. This helps reduce variations in the parasitic capacitance formed between the source and drain electrodes 9 and 10 and the gate electrode 5. The protruding portion on the source electrode 9 side and that on the drain electrode 10 side are separated from each other by the gate electrode 5 so as to form insular patches that are independent of each other. This prevents short-circuiting between the source and drain that results when the portions of the semiconductor island 7 protruding out of the gate electrode 5 become conductive through an photoelectric effect brought about by the light that travels past the gate electrode 5 or by another cause.

Figure 8:
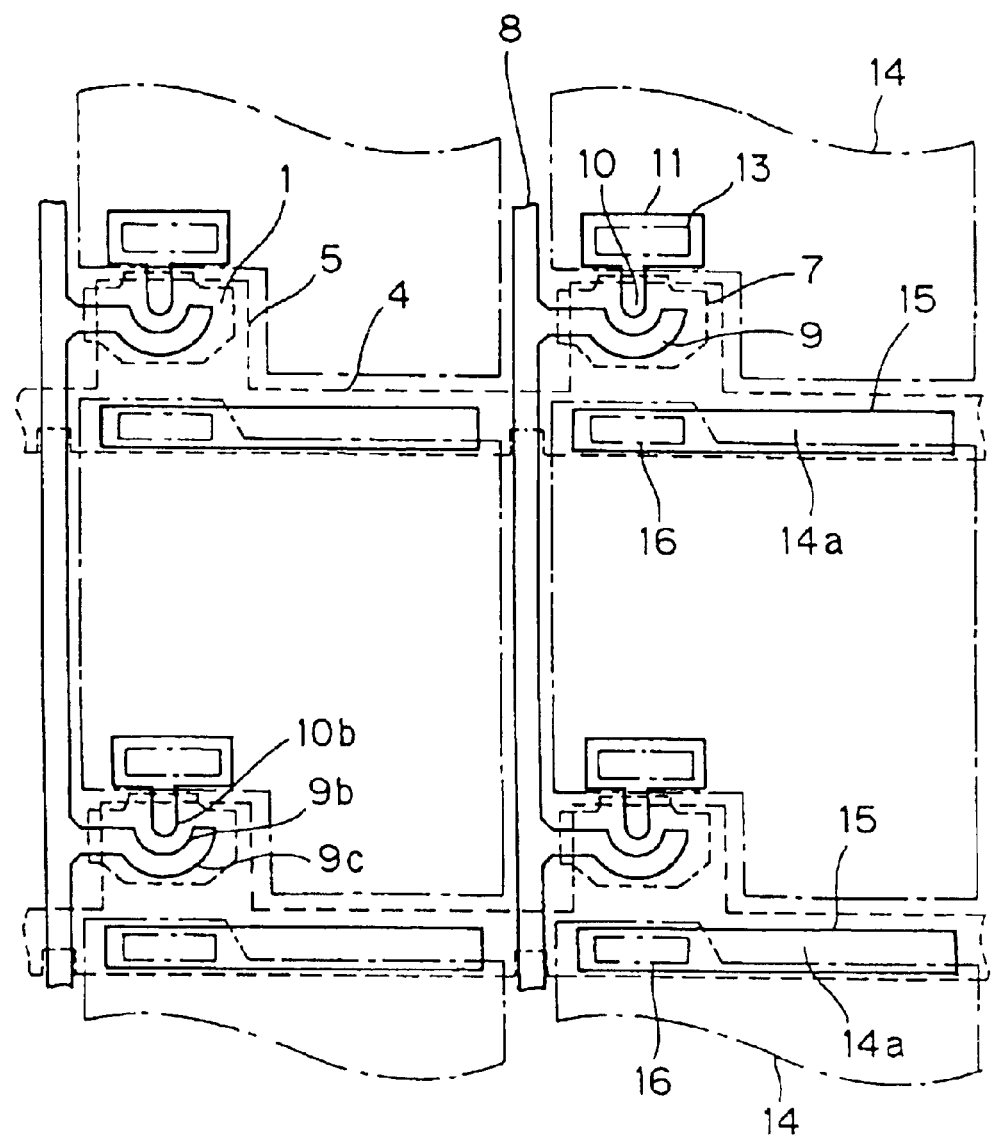
FIG. 8 is a plan view showing the array structure of the TFTs of the second embodiment.

FIG. 8 shows how a plurality of TFTs 1, each structured as described above, are combined individually with pixel electrodes 14 to form an array. The TFT array 2 of the second embodiment differs from that of the first embodiment in some respects. The differences will be described below.

In the TFT 1 of the second embodiment, on top of the gate insulating film 6, an auxiliary capacitance electrode 15 is formed. The auxiliary capacitance electrode 15 is formed, after the formation of the semiconductor island 7, simultaneously with the source conductor 8, source electrode 9, drain electrode 10, and contact electrode 11. The auxiliary capacitance electrode 15, too, is covered, from above, with the protective film 12. In the protective film 12, a contact hole 16 is formed that leads to the auxiliary capacitance electrode 15. Thus, the pixel electrode 14, at one end, connects to the TFT 1 through the contact hole 13 and, at the other end, connects to the auxiliary capacitance electrode 15 through the contact hole 16.

The gate insulating film 6 and the protective film 12, formed below the pixel electrode 14, are removed except where they connect to the pixel electrode 14 and to the electrodes and conductors formed below it. Thus, the greater part of the pixel electrode 14 makes direct contact with the substrate 3. By removing the insulating and protective films formed below the pixel electrode 14 in this way, it is possible to increase the amount of transmitted light.

The pixel electrode 14 is arranged so as not to perspectively overlap the gate electrode 5, which shields light. The pixel electrode 14 has a cut formed at one corner thereof to allow the TFT 1 in. This leaves a space in which to place the TFT 1 between the pixel electrode 14 of one stage and the pixel electrode 14 of the next stage. Instead of arranging the TFT 1 and the pixel electrode 14 in such a way that they do not overlap each other in this way, it is also possible, in a case where an interlayer insulation layer is formed to cover the TFT 1, to arrange the TFT 1 and pixel electrode 14 in such a way that they perspectively overlap each other.

The auxiliary capacitance electrode 15 is sandwiched between the gate insulating film 6 and the protective film 12, from above and from below, and is arranged so as to perspectively overlap the gate conductor 4 without protruding out of the gate conductor 4. The length of the auxiliary capacitance electrode 15 is roughly equal to or slightly smaller than the dimension of the pixel electrode 14 in the direction of the shorter sides thereof (i.e., in the direction in which the gate conductor 4 extends).

It is advisable that the contact hole 16 be formed in such a way as to be located within half the dimension of the pixel electrode 14 in the direction of the shorter sides thereof, preferably within the dimension of the TFT 1 as projected on the gate conductor 4, or alternatively within the dimension of the source electrode 9 as projected on the gate conductor 4, or alternatively within the dimension of the contact electrode 11 as projected on the gate conductor 4. The contact hole 16 so sized is formed lopsidedly in that side of the pixel electrode 14 where the TFT 1 is formed. Thus, while the pixel electrode 14 needs to reach the contact hole 16 in that side of the pixel electrode 14 where the contact hole 16 is formed, there is no such requirement in that side of the pixel electrode 14 in which the contact hole 16 is not formed, and therefore, in this side of the pixel electrode 14, the shape of the pixel electrode 14 can be designed comparatively freely. By exploiting this freedom in design, a cut 14a through which the auxiliary capacitance electrode 15 is exposed is formed in that side of the pixel electrode 14 where the contact hole 16 is formed. This cut 14a helps widen the interval between the pixel electrode of one stage and that of the next, and thus helps prevent short-circuiting between adjacent pixel electrodes and the resulting degradation in display quality.

Figure 9:
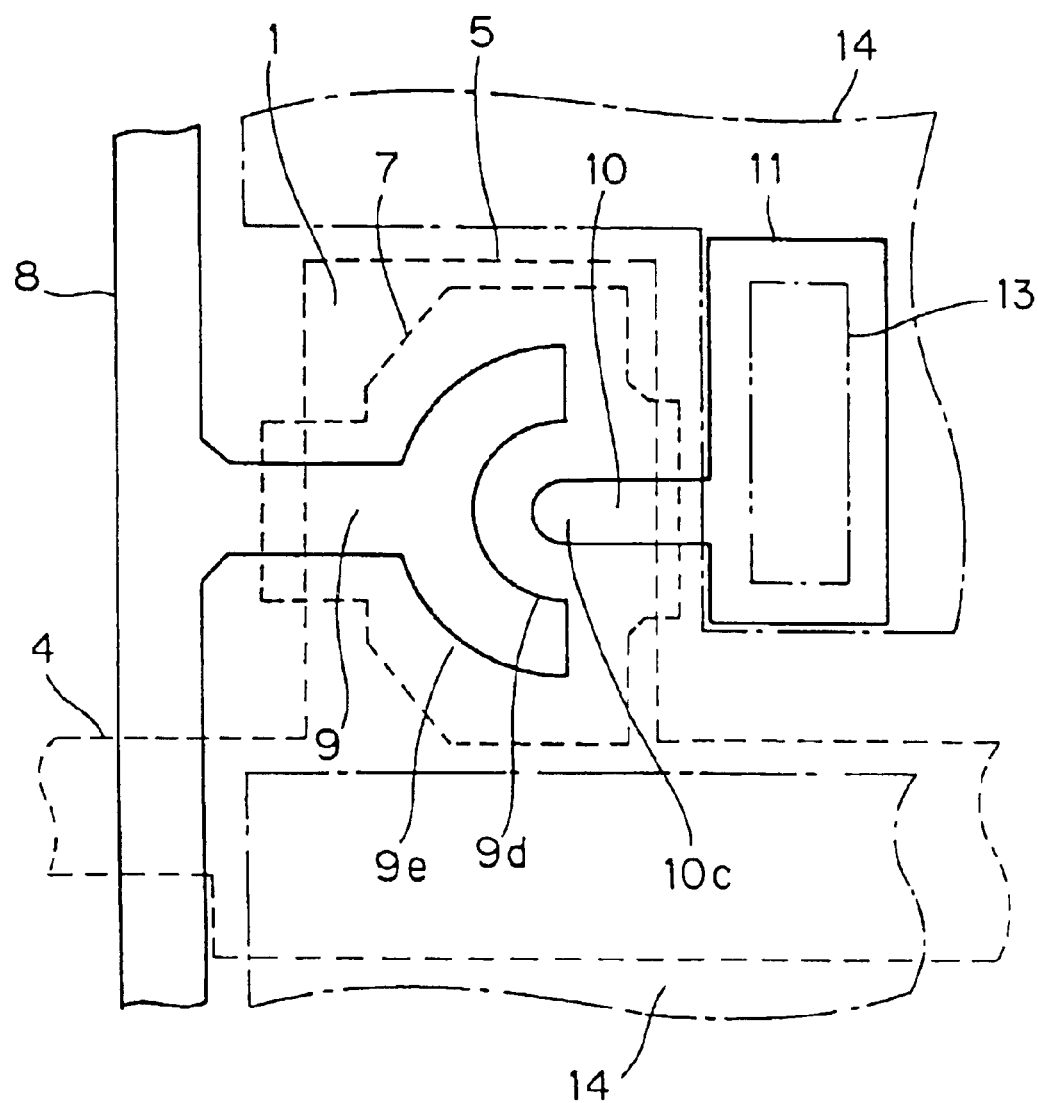
FIG. 9 is a plan view schematically showing the structure of the TFT of a third embodiment of the invention.
Figure 10:
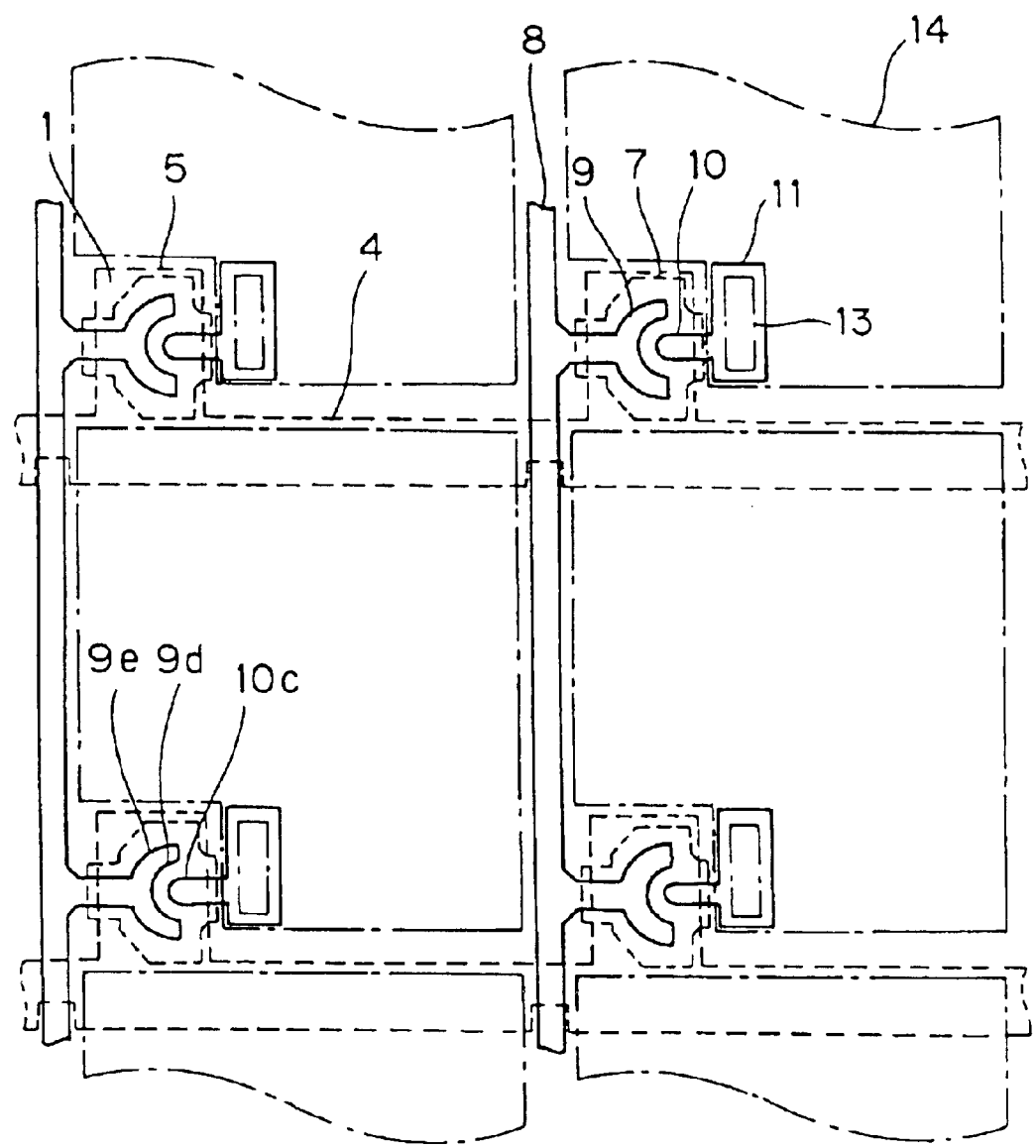
FIG. 10 is a plan view showing the array structure of the TFTs of the third embodiment.
Figure 11:
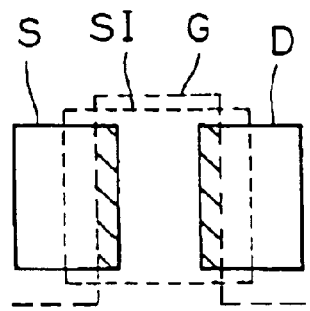
FIG. 11 is a plan view schematically showing the structure of a conventional TFT.
Figure 12:
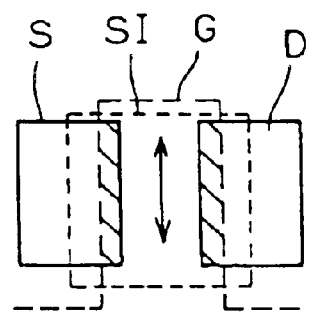
FIG. 12 is a plan view similar to FIG. 11, showing another state.
Figure 13:
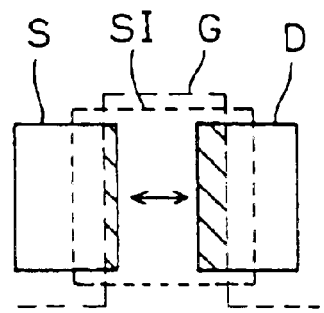
FIG. 13 is a plan view similar to FIG. 11, showing still another state.

FIGS. 9 and 10 show the structure of the TFT 1 of a third embodiment of the invention. In this TFT 1 also, both the source electrode 9 and the drain electrode 10 are elongate, i.e., longer in their lengthwise direction than in their widthwise direction. This embodiment is characterized in that the source and drain electrodes 9 and 10 are arranged in such a way that their lengthwise directions are aligned on a straight line. Thus, both the source and drain electrodes 9 and 10 have their lengthwise direction running perpendicularly to the source conductor 8 and parallel to the gate conductor 4.

Here also, the greater parts of both the source and drain electrodes 9 and 10 perspectively overlap the semiconductor island 7, and perspectively overlap the gate electrode 5 with the semiconductor island 7 and the gate insulating film 6 interposed in between. Both the source and drain electrodes 9 and 10 are so arranged that their lengthwise direction perpendicularly crosses an edge of the gate electrode 5. The source electrode 9, in its portion protruding out of the semiconductor island 7, connects to the source conductor 8, and the drain electrode 10, in its portion protruding out of the semiconductor island 7, connects to the contact electrode 11.

The tip portion 10c of the drain electrode 10 faces the tip portion of the source electrode 9 with a predetermined interval (channel width) secured in between. Here, as in the second embodiment, the edge of the tip portion 10c of the drain electrode 10 is so formed as to describe a convex arc as the most typical example of a convex curve. The source electrode 9 has a recessed portion 9d formed in its tip portion to allow the tip portion 10c of the drain electrode 10 in, and the recessed portion 9d is so formed as to described a concave arc as the most typical example of a concave curve. Thus, the channel formed between the tip portion 10c of the drain electrode 10 and the recessed portion 9d of the source electrode 9 is arc-shaped. The edge 9e of the source electrode 9 opposite to the recessed portion 9d is so formed as to described a convex arc. The convex arc of the tip portion 10c of the drain electrode 10, the concave arc of the recessed portion 9d of the source electrode 9, and the convex of the edge 9e thereof are concentric.

In this structure, the source and drain electrodes 9 and 10 are aligned on a straight line in their lengthwise direction, and are so shaped as to be symmetric about their mid line extending in their lengthwise direction. This makes it easy to form the electrodes exactly as designed. This is particularly true with the source electrode 9.

Moreover, the source and drain electrodes 9 and 10 are not only aligned on a straight line in their lengthwise direction, but are also arranged perpendicularly to the source conductor 8 so that their lengthwise direction perpendicularly crosses an edge of the gate electrode 5. Accordingly, even if the positions of those electrodes deviate slightly in the vertical direction of the figure (i.e., parallel to the source conductor 8), the gate-drain parasitic capacitance remains unchanged. By contrast, if the positions of the source and drain electrodes 9 and 10 deviate in the horizontal direction of the figure (perpendicularly to the source conductor 8), the areas over which the source and drain electrodes 9 and 10 overlap the gate electrode 5 vary. That is, the gate-drain parasitic capacitance varies. Thus, while accurate positioning is required in the horizontal direction of the figure, not so accurate positioning is required in the vertical direction of the figure.

On the other hand, if the source conductor 8 and the pixel electrode 14 are too close to each other, even when the protective film 12 is interposed between them, the voltage applied to the source conductor 8 jumps to the pixel electrode 14, and causes defective display. Therefore, when the source conductor 8 and the pixel electrode 14 are formed, high accuracy is required in positioning in the horizontal direction of the figure so that they are arranged with the designed interval. In the third embodiment, the source and drain electrodes 9 and 10 of the TFT 1 are arranged in the horizontal direction of the figure, and thus, when the source conductor 8 and the pixel electrode 14 are formed, high accuracy is required only in the horizontal direction of the figure. That is, high accuracy is required in only one direction, and this makes fabrication easier than in a case where accuracy is required in two directions, i.e., in the vertical and horizontal directions.

In the TFT 1 of the third embodiment, as in the TFT 1 of the second embodiment, the recessed portion 9d of the source electrode 9 has a concave curve (arc) and the edge 9e opposite thereto has a convex curve (arc). This helps make the width of the source electrode 9 between the recessed portion 9d and the edge 9e uniform and as small as possible, and thus helps alleviate the influence of parasitic capacitance.

The semiconductor island 7 has to be located only in a region in which it overlaps the source and drain electrodes 9 and 10 and the channel region, and it is rather undesirable to locate the semiconductor island 7 elsewhere. This is to minimize the leak current produced through a photoelectric effect when light is incident on the semiconductor island 7. The portion of the semiconductor island 7 that overlaps the gate electrode 5 does not receive the light from a backlight because the gate electrode 5 shields the light. Even this portion may receive the light reflected from a color filter array arranged so as to face the TFT array 2. Therefore, it is advisable to remove as much of the unnecessary portion of the semiconductor island 7 as possible even in the region in which it overlaps the gate electrode 5. Accordingly, the semiconductor island 7 is so shaped that its profile runs along the profiles of the source and drain electrodes 9 and 10, with the portion of the semiconductor island 7 away from the source and drain electrode 9 and 10 cut off. This makes the semiconductor island 7 less likely to receive light, and thus helps reduce variations in the various characteristics of the TFT 1. This design technique of giving the semiconductor island 7 a profile that runs along the profiles of the source and drain electrodes 9 and 10 is applied to the TFTs 1 of the first and second embodiments also.

In the TFT 1 of the third embodiment also, the channel between the source and drain electrodes 9 and 10 has a nonlinear shape, and this makes it possible to secure a comparatively long total channel length. Where the source electrode 9 crosses an edge of the gate electrode 5, the semiconductor island 7 protrudes slightly out of the gate electrode 5, forming a protruding portion in which the semiconductor island 7 does not overlap the gate electrode 5 but overlaps the source electrode 9. Likewise, where the drain electrode 10 crosses an edge of the gate electrode 5, the semiconductor island 7 protrudes slightly out of the gate electrode 5, forming a protruding portion in which the semiconductor island 7 does not overlap the gate electrode 5 but overlaps the drain electrode 10. This helps reduce variations in the parasitic capacitance formed between the source and drain electrodes 9 and 10 and the gate electrode 5. The protruding portion on the source electrode 9 side and that on the drain electrode 10 side are separated from each other by the gate electrode 5 so as to form insular patches that are independent of each other. This prevents short-circuiting between the source and drain that results when the portions of the semiconductor island 7 protruding out of the gate electrode 5 become conductive through an photoelectric effect brought about by the light that travels past the gate electrode 5 or by another cause.

The TFT arrays 2 of the embodiments described above can be used on one of the two substrates that constitute a display device that uses transistors to drive display pixels, such as a liquid crystal display device having liquid crystal sealed between two substrates or an organic or inorganic EL display device. The embodiments described above all deal with TFTs having an inverted staggered structure using amorphous silicon; however, the TFT array may be formed by using TFTs of any other type, such as TFTs having a noninverted staggered structure or TFTs having semiconductor islands formed of polycrystalline silicon.

Industrial Applicability

The present invention finds wide application in display devices that use transistors to drive display pixels, and is useful in realizing display devices that achieves stable, high-quality display.

What is claimed is:

1. A transistor having a source electrode and a drain electrode formed side by side with a predetermined interval secured in between on a semiconductor layer formed so as to perspectively overlap a gate electrode, characterized by an edge of the drain electrode that faces the source electrode having corners rounded so as to describe a convex curved line, an edge of the source electrode that faces the drain electrode being formed so as to describe a concave curved line corresponding to the edge of the drain electrode describing the convex curved line, an edge of the source electrode that does not face the drain electrode being formed so as to describe a convex curved line along the edge of the source electrode that faces the drain electrode so that the source electrode has a substantially uniform width, the semiconductor layer protruding out of the gate electrode to form a portion that overlaps the source electrode and a portion that overlaps the drain electrode, with the protruding portion that overlaps the source electrode and the protruding portion that overlaps the drain electrode separated from each other by the gate electrode so as to be independent of each other, a portion of the semiconductor layer that overlaps the gate electrode and that faces the edge of the source electrode that does not face the drain electrode being partially cut off along a profile of the source electrode.

2. A transistor having a source electrode and a drain electrode formed side by side with a predetermined interval secured in between on a semiconductor layer formed so as to perspectively overlap a gate electrode, characterized by an edge of the drain electrode that faces the source electrode being formed so as to describe a convex arc, an edge of the source electrode that faces the drain electrode being formed so as to describe a concave arc along the convex-arc-shaped edge of the drain electrode so that a distance between the source and drain electrodes is substantially uniform, an edge of the source electrode that does not face the drain electrode being formed so as to describe a convex arc along the edge of the source electrode that faces the drain electrode so that the source electrode has a substantially uniform width, the semiconductor layer protruding out of the gate electrode to form a portion that overlaps the source electrode and a portion that overlaps the drain electrode, with the protruding portion that overlaps the source electrode and the protruding portion that overlaps the drain electrode separated from each other by the gate electrode so as to be independent of each other, a portion of the semiconductor layer that overlaps the gate electrode and that faces the edge of the source electrode that does not face the drain electrode being given a profile that runs along a profile of the source electrode.

3. A display device that achieves display by using transistors as claimed in claim 1 or 2, characterized by gate conductors and source conductors being arranged in a grid-like configuration, the transistors being located at intersections between the gate and source conductors, the drain electrodes of the transistors being arranged substantially parallel to the source conductors.

4. A display device that achieves display by using transistors as claimed in claim 1 or 2, characterized by source conductors and gate conductors being arranged in a grid-like configuration, the transistors being located at intersections between the source and gate conductors, the drain electrodes of the transistors being arranged substantially perpendicularly to the source conductors.

5. A display device as claimed in claim 3, further characterized by the transistors, together with pixel electrodes connected thereto, being arranged in cells sectioned off by the gate and source conductors, auxiliary capacitance electrodes sandwiched between a gate insulating film and a protective film from above and from below being arranged between the gate conductor of each stage and the pixel electrode of a next stage arranged so as to overlap the gate conductor, contact holes being formed in the protective film lopsidedly in a side of each stage where the transistors are formed so as to permit the auxiliary capacitance electrodes to connect to the pixel electrodes, cuts being formed at edges of the pixel electrodes located above the auxiliary capacitance electrodes in a side of each stage opposite to where the contact holes are formed.

6. A display device as claimed in claim 5, further characterized by the transistors, together with pixel electrodes connected thereto, being arranged in cells sectioned off by the gate and source conductors, auxiliary capacitance electrodes sandwiched between a gate insulating film and a protective film from above and from below being arranged between the gate conductor of each stage and the pixel electrode of a next stage arranged so as to overlap the gate conductor, contact holes being formed in the protective film lopsidedly in a side of each stage where the transistors are formed so as to permit the auxiliary capacitance electrodes to connect to the pixel electrodes, cuts being formed at edges of the pixel electrodes located above the auxiliary capacitance electrodes in a side of each stage opposite to where the contact holes are formed.

* * * * *